(12) United States Patent
Li

(10) Patent No.: US 10,692,948 B2
(45) Date of Patent: Jun. 23, 2020

(54) ARRAY SUBSTRATE, MANUFACTURING METHOD THEREOF AND DISPLAY PANEL

(71) Applicant: Wuhan China Star Optoelectronics Semiconductor Display Technology Co., Ltd., Wuhan, Hubei (CN)

(72) Inventor: Songshan Li, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 274 days.

(21) Appl. No.: 15/578,299

(22) PCT Filed: Aug. 29, 2017

(86) PCT No.: PCT/CN2017/099484
§ 371 (c)(1),
(2) Date: Nov. 30, 2017

(87) PCT Pub. No.: WO2019/015023
PCT Pub. Date: Jan. 24, 2019

(65) Prior Publication Data
US 2019/0221626 A1   Jul. 18, 2019

(30) Foreign Application Priority Data
Jul. 18, 2017 (CN) .......................... 2017 1 0584353

(51) Int. Cl.
*H01L 29/786* (2006.01)
*H01L 27/32* (2006.01)
(Continued)

(52) U.S. Cl.
CPC ...... *H01L 27/3262* (2013.01); *H01L 27/1225* (2013.01); *H01L 27/1237* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 8,343,817 B2 | 1/2013 | Miyairi et al. | |
| 2005/0008834 A1 | 1/2005 | Chang et al. | |
| 2007/0090358 A1* | 4/2007 | Kanno | ............ H01L 27/12 257/59 |

FOREIGN PATENT DOCUMENTS

| | | |
|---|---|---|
| CN | 1329368 | 1/2002 |
| CN | 102082180 | 6/2011 |

* cited by examiner

*Primary Examiner* — Mohammad M Choudhry
(74) *Attorney, Agent, or Firm* — Hemisphere Law, PLLC; Zhigang Ma

(57) ABSTRACT

An array substrate is provided, including a substrate, a driver thin film transistor and a switch thin film transistor disposed on the substrate, the driver thin film transistor and the switch thin film transistor both include a gate, a gate insulating layer, an active layer, a source, and a drain. A barrier layer is disposed between the gate and the gate insulating layer of the driver thin film transistor. A manufacturing method thereof includes forming a barrier layer on the gate of the driver thin film transistor. Compared with existing arts, forming a barrier layer between the gate and the gate insulating layer of the driver thin film transistor to prevent its active layer from water and active oxygen ions affections can improve the electrical property and reliability of the thin film transistor, and ensure the normal operation for driving the driver thin film transistor of organic light emitting diode.

10 Claims, 1 Drawing Sheet

(51) Int. Cl.
*H01L 51/56* (2006.01)
*H01L 51/52* (2006.01)
*H01L 29/49* (2006.01)
*H01L 27/12* (2006.01)

(52) U.S. Cl.
CPC ...... *H01L 29/4908* (2013.01); *H01L 29/7869* (2013.01); *H01L 51/5237* (2013.01); *H01L 51/56* (2013.01); *H01L 27/3244* (2013.01)

US 10,692,948 B2

ARRAY SUBSTRATE, MANUFACTURING METHOD THEREOF AND DISPLAY PANEL

RELATED APPLICATIONS

The present application is a National Phase of International Application Number PCT/CN2017/099484, filed Aug. 29, 2017, and claims the priority of China Application No. 201710584353.4, filed Jul. 18, 2017.

FIELD OF THE DISCLOSURE

The present disclosure relates to a display panel technology, and more particularly to an OLED array substrate, a manufacturing method thereof, and a display panel.

BACKGROUND

As organic light emitting diode (OLED) panels are gaining popularity, their thickness is thinner relative to LCD panels due to the absence of additional back light components. Wherein indium gallium zinc oxide (IGZO) in metal oxide semiconductors, due to the advantages of high electron mobility, low current leakage, and low preparation temperature, have aroused widespread concern.

In the conventional bottom gate type IGZO thin film transistor, during the process of manufacturing, the gate insulating layer at the switch thin film transistor (Switch TFT) and the driver thin film transistor (Driver TFT) generally adopts SiOx material. However, the hydrophilicity of SiOx is relatively strong and has a strong ability to absorb water and oxygen at room temperature. After the TFT works for a certain period, the electrical properties of the TFT will be seriously affected, resulting in a large shift of the threshold voltage, the reliability becomes poor, and TFT properties are serious deteriorated.

SUMMARY

In order to overcome the shortcomings of the prior arts, the present disclosure provides an array substrate, a manufacturing method thereof, and a display panel, for improving the typicality and reliability of the thin film transistor and ensuring the normal operation of the driver thin film transistor.

The present disclosure provides an array substrate, comprises a substrate. A driver thin film transistor and a switch thin film transistor are disposed on the substrate. The driver thin film transistor and the switch thin film transistor both comprise a gate, a gate insulating layer, an active layer, a source, and a drain. A barrier layer is further disposed between the gate and the gate insulating layer of the driver thin film transistor.

Furthermore, a material of the barrier layer is SiNx.

Furthermore, the active layer is an oxide thin film transistor, and/or the driver thin film transistor and the switch thin film transistor is a bottom-gate thin film transistor.

Furthermore, the array substrate further comprises a passivation layer and a planarization layer disposed over the driver thin film transistor and the switch thin film transistor. An anode is connecting to the source and the drain of the driver thin film transistor via via holes of the planarization layer and the passivation layer.

The present disclosure further provides a method of manufacturing an array substrate, comprising the steps of:

Step S1, patterning a gate layer prepared on the substrate to obtain gates of the driver thin film transistor and the switch thin film transistor.

Step S2, forming a barrier layer on the gate of the driver thin film transistor;

Step S3, depositing a gate insulating layer on the substrate.

Step S4, forming an active layer on the gate insulating layer above the gates of the driver thin film transistor and the switch thin film transistor.

Step S5, fabricating a source and a drain on the active layer.

Furthermore, the step S2 of forming a barrier layer on the gate of the driver thin film transistor particularly comprises: patterning a SiNx layer deposited on the gate of the driver thin film transistor by a plasma enhanced chemical vapor deposition process to obtain the barrier layer.

Furthermore, the active layer is an oxide thin film transistor.

Furthermore, the driver thin film transistor and the switch thin film transistor are bottom-gate thin film transistors.

Furthermore, the method of manufacturing an array substrate further comprises:

Step S6, forming a passivation layer on the substrate, the passivation layer covering the source and the drain.

Step S7, fabricating a planarization layer on the passivation layer.

Step S8, forming an anode on the planarization layer, the anode connecting to the source and the drain of the driver thin film transistor via via holes of the planarization layer and the passivation layer.

The present disclosure further provides a display panel, comprising the foregoing array substrate.

Compared with the existing arts, by providing a barrier layer between the gate and the gate insulating layer of the driver thin film transistor to prevent the active layer of the driver thin film transistor from water and active oxygen ions affections can improve the electrical property and reliability of the thin film transistor, and ensure the normal operation for driving the driver thin film transistor of organic light emitting diode.

DETAILED DESCRIPTION OF PREFERRED EMBODIMENTS

The present disclosure will be further described in the following description with reference to the accompanying drawings and embodiments.

Figure 3:
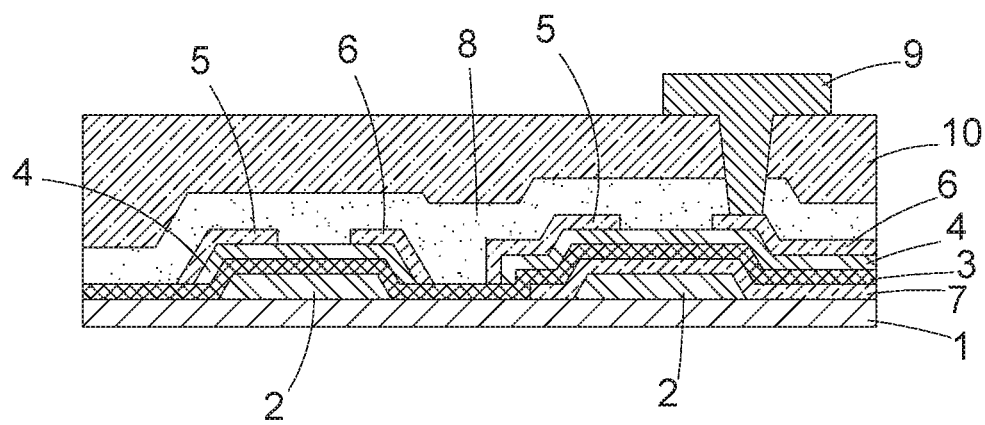
FIG. 3 is a schematic structural view after fabricating a passivation layer, a planarization layer and an anode of the present disclosure.

As shown in FIG. 3, an array substrate provide by the present disclosure is applied on OLED panel. The array substrate comprises a substrate 1, a driver thin film transistor and a switch thin film transistor are disposed on the substrate. Specifically, the driver thin film transistor and the switch thin film transistor both comprise a gate 2, a gate insulating layer 3, an active layer 4, a source 5, and a drain 6. A barrier layer 7 is further disposed between the gate 2 and the gate insulating layer 3 of the driver thin film transistor. A passivation layer 8 is disposed over the driver thin film transistor and the switch thin film transistor above the source 5 and the drain 6, a planarization layer 10 is disposed on the passivation layer 8. An anode 9 connecting to the source 5 and the drain 6 of the driver thin film transistor via via holes of the planarization layer 10 and the passivation layer 8.

By providing the barrier layer 7 between the gate 2 and the gate insulating layer 3 of the driver thin film transistor to prevent the active layer of the driver thin film transistor from water and active oxygen ions affections can improve the electrical property and reliability of the thin film transistor, and ensure the normal operation for driving the driver thin film transistor of organic light emitting diode.

The material of the barrier layer 7 is Silicon Nitride (SiNx). Since the hydrophilic of SiNx is much smaller than SiOx, which used as the material of the gate insulating layer 3, it is capable of blocking water, oxygen, and impurity ions.

The active layer 4 of the present disclosure is an oxide thin film transistor, in particularly, is a metal oxide thin film transistor. In one embodiment of the present disclosure, the active layer 4 is Indium Gallium Zinc Oxide (IGZO).

The driver thin film transistor and the switch thin film transistor are bottom-gate thin film transistors.

Figure 1:
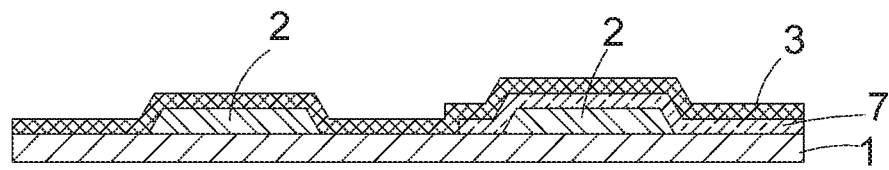
FIG. 1 is a schematic structural view of fabricating a barrier layer and a gate insulating layer of the present disclosure.

A method of manufacturing an array substrate according to the present disclosure comprises the following steps:

Step S1, as shown in FIG. 1. Patterning a gate layer prepared on the substrate to obtain gates of the driver thin film transistor and the switch thin film transistor. Specifically, depositing a layer of Molybdenum (Mo) on the glass substrate 1 by a physical vapor deposition process, and then patterning the Mo layer to obtain the gate 2 of the driver thin film transistor and a switch thin film transistor.

Step S2, as shown in FIG. 1. Forming a barrier layer 7 on the gate 2 of the driver thin film transistor. Specifically, depositing a SiNx layer on the gate 2 of the driver thin film transistor by a plasma enhanced chemical vapor deposition process, and then patterning the SiNx layer to obtain the barrier layer 7.

Step S3, as shown in FIG. 1. Depositing a gate insulating layer 3 on the substrate 1, making the gate insulating layer 3 covering the barrier layer 7. The depositing material of the gate insulating layer 3 is Silicon Oxide (SiOx).

Figure 2:
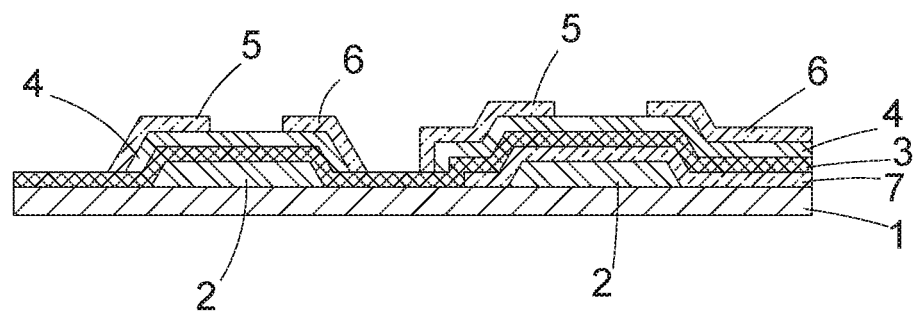
FIG. 2 is a schematic structural view of fabricating an active layer, a source and a drain on the gate insulating layer of the present disclosure.

Step S4, as shown in FIG. 2. Forming an active layer 4 on the gate insulating layer 3 above the gates of the driver thin film transistor and the switch thin film transistor. Specifically, depositing an layer of IGZO by physical vapor deposition and then pattering the IGZO layer to obtain the active layer 4. The active layer 4 is disposed on the gate 2 of the driver thin film transistor and the switch thin film transistor.

Step S5, as shown in FIG. 2, Fabricating a source 5 and a drain 6 on the active layer 4. Specifically, depositing a metal layer by physical vapor deposition, and then patterning the metal layer by a back channel etch process (BCE) to obtain the source 5 and the drain 6.

Step S6, as shown in FIG. 3. Forming a passivation layer 8 on the substrate 1, the passivation layer 8 covers the source 5 and the drain 6. Specifically, fabricating a SiOx layer on the source 5 and the drain 6 and then pattering the SiOx layer to obtain the passivation layer 8. Fabricating via holes on the passivation layer 8 above the source 5 or the drain 6 of the driver thin film transistor. In particularly, fabricating a via hole above the drain 6.

Step S7, as shown in FIG. 3. Fabricating a planarization layer 10 on the passivation layer 8. Specifically, fabricating an organic photoresist insulation and patterning the organic photoresist insulation to form the planarization layer 10, and forming a via hole on the planarization layer 10 at the position of the via hole of the passivation layer 8.

Step S8, as shown in FIG. 3. Forming an anode 9 on the planarization layer 10, the anode 9 is connecting to the source 5 and the drain 6 of the driver thin film transistor via via holes of the planarization layer 10 and the passivation layer 8.

The driver thin film transistor and the switch thin film transistor of the present disclosure are bottom-gate thin film transistors.

The present disclosure further provides a display panel comprising the foregoing array substrate, which will not be repeated herein.

The array substrate of the present disclosure is particularly suitable for being applied in a thin film transistor backplane of an active-matrix organic light emitting diode (AMOLED).

While the disclosure has been particularly shown and described with reference to exemplary embodiments thereof, it will be understood by those skilled in the art that various changes in form and details may be made therein without departing from the spirit and scope of the disclosure as defined by the appended claims and their equivalents.

What is claimed is:

1. An array substrate, comprising a substrate, wherein a driver thin film transistor and a switch thin film transistor are disposed on the substrate; the driver thin film transistor and the switch thin film transistor both comprise a gate, a gate insulating layer, an active layer, a source, and a drain; a barrier layer is further disposed between the gate and the gate insulating layer of the driver thin film transistor,
   wherein a passivation layer and a planarization layer different from the passivation layer are sequentially disposed over the driver thin film transistor and the switch thin film transistor, and an anode is directly connected to the source or the drain of the driver thin film transistor through via holes of the planarization layer and the passivation layer.

2. The array substrate according to claim 1, wherein a material of the barrier layer is SiNx.

3. The array substrate according to claim 1, wherein the active layer is made of Indium Gallium Zinc Oxide.

4. A method of manufacturing an array substrate, comprising the steps of:
   step S1, patterning a gate layer prepared on the substrate to obtain gates of the driver thin film transistor and the switch thin film transistor;
   step S2, forming a barrier layer on the gate of the driver thin film transistor;
   step S3, depositing a gate insulating layer on the substrate;
   step S4, forming an active layer on the gate insulating layer above the gates of the driver thin film transistor and the switch thin film transistor;
   step S5, fabricating a source and a drain on the active layer;
   step S6, forming a passivation layer on the substrate, the passivation layer covering the source and the drain;
   step S7, fabricating a planarization layer different from the passivation layer on the passivation layer; and
   step S8, forming an anode on the planarization layer, the anode is directly connected to the source and the drain of the driver thin film transistor through via holes of the planarization layer and the passivation layer.

5. The method of manufacturing an array substrate according claim 4, wherein the step S2 of forming a barrier layer on the gate of the driver thin film transistor particularly comprises: pattering a SiNx layer deposited on the gate of the driver thin film transistor by a plasma enhanced chemical vapor deposition process to obtain the barrier layer.

6. The method of manufacturing an array substrate according to claim 4, wherein the active layer is made of Indium Gallium Zinc Oxide.

7. The method of manufacturing an array substrate according to claim 6, wherein the driver thin film transistor and the switch thin film transistor are bottom-gate thin film transistors.

8. A display panel, comprising an array substrate, the array substrate comprising a substrate, wherein a driver thin film transistor and a switch thin film transistor are disposed on the substrate; the driver thin film transistor and the switch thin film transistor both comprise a gate, a gate insulation layer, an active layer, a source and a drain; a barrier layer is further disposed between the gate and the gate insulating layer of the driver thin film transistor, wherein a passivation layer and a planarization layer different from the passivation layer are sequentially disposed over the driver thin film transistor and the switch thin film transistor, and an anode is directly connected to the source or the drain of the driver thin film transistor through via holes of the planarization layer and the passivation layer.

9. The display panel according to claim 8, wherein a material of the barrier layer is SiNx.

10. The display panel according to claim 8, wherein the active layer is made of Indium Gallium Zinc Oxide.

\* \* \* \* \*